United States Patent
Chung

(10) Patent No.: US 8,193,588 B2
(45) Date of Patent: Jun. 5, 2012

(54) SEMICONDUCTOR DEVICE

(75) Inventor: Su Ock Chung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/087,072

(22) Filed: Apr. 14, 2011

(65) Prior Publication Data

US 2011/0198697 A1    Aug. 18, 2011

Related U.S. Application Data

(62) Division of application No. 12/326,276, filed on Dec. 2, 2008, now Pat. No. 7,947,541.

(30) Foreign Application Priority Data

Apr. 24, 2008    (KR) .................. 10-2008-0038345

(51) Int. Cl.
*H01L 27/01* (2006.01)
*H01L 27/12* (2006.01)
*H01L 31/0392* (2006.01)

(52) U.S. Cl. .......... 257/347; 257/E29.273; 438/151

(58) Field of Classification Search ............. 257/347, 257/E29.273; 438/151
See application file for complete search history.

(56) References Cited

U.S. PATENT DOCUMENTS

| 6,294,817 | B1 | 9/2001 | Srinivasan et al. |
| 7,480,198 | B2* | 1/2009 | Fujita ............... 365/205 |
| 7,969,808 | B2* | 6/2011 | Song et al. ........... 365/222 |
| 2007/0161181 | A1 | 7/2007 | Song et al. |
| 2008/0150014 | A1 | 6/2008 | Hwang et al. |
| 2008/0246082 | A1* | 10/2008 | Hshieh .............. 257/333 |
| 2009/0004855 | A1 | 1/2009 | Lee et al. |
| 2009/0296453 | A1* | 12/2009 | Lee et al. ........... 365/149 |

FOREIGN PATENT DOCUMENTS

| KR | 10-2002-0052458 | 7/2002 |
| KR | 10-2004-0008478 | 1/2004 |
| KR | 10-0419024 | 2/2004 |
| KR | 10-2006-0002056 | 1/2006 |

* cited by examiner

*Primary Examiner* — Phuc Dang
(74) *Attorney, Agent, or Firm* — Marshall, Gerstein & Borun LLP

(57) ABSTRACT

A method for fabricating a semiconductor device comprises: forming a gate pattern over a silicon active region and an insulating layer, which form a semiconductor substrate; removing the silicon active region exposed between the gate patterns; and filling a space between the gate patterns to form a plug.

7 Claims, 7 Drawing Sheets

SEMICONDUCTOR DEVICE

CROSS-REFERENCE TO RELATED APPLICATIONS

This is a division of U.S. application Ser. No. 12/326,276 filed Dec. 2, 2008, now U.S. Pat. No. 7,947,541, which claims the priority benefit under USC 119 of KR 10-2008-0038345 filed Apr. 24, 2008, the entire respective disclosures of which are incorporated herein by reference.

BACKGROUND OF THE INVENTION

The present invention relates generally to a method for fabricating a semiconductor device, and more specifically, to a method of forming a floating body transistor used in a highly-integrated semiconductor device using a silicon-on-insulator (SOI) substrate.

In a system containing a plurality of semiconductor devices, a semiconductor memory apparatus is configured to store data generated or processed therein. For example, if a request from a data processor such as a central processing unit (CPU) is received, the semiconductor memory apparatus outputs data to the data processor from unit cells therein or stores data processed by the data processor to the unit cells, according to an address transmitted with the request.

Recently, data storage capacity of the semiconductor memory apparatus has increased, but the size of the semiconductor memory apparatus has not increased proportionally. Thus, the size of each of the multiple unit cells included in the semiconductor memory apparatus has dwindled, and the sizes of various components and elements for read or write operations has been reduced. Accordingly, components and elements duplicated unnecessarily in the semiconductor memory apparatus, such as transistors or wires, are combined or merged to decrease the area occupied by each component. Particularly, the reduction of the size of unit cells included in the semiconductor memory apparatus affects improvement of integration because the unit cells occupy one of the largest areas therein.

An example of a semiconductor memory apparatus is Dynamic Random Access Memory (DRAM), which is a type of a volatile memory device configured to retain data while a power source is supplied. The unit cell comprises a transistor and a capacitor. In the case of the unit cell having a capacitor, after the data "1" is delivered to the capacitor, charges that are temporarily stored in the storage node are dissipated, i.e., the number of charges are reduced, because of both leakage currents generated at junction of the storage nodes and inherent characteristics of the capacitor which actually lost charges while time passes. As a result, a refresh operation is periodically required on the unit cells so that data of the DRAM cannot be destroyed.

To prevent the reduction of charges, numerous methods for increasing capacitance (Cs) of the capacitor included in the unit cell have been suggested so that more charges may be stored in the storage node. For example, a prior insulating film of the capacitor, for example, an oxide film, is replaced with an advanced insulating film that has a larger dielectric constant, such as a nitrified oxide film, and a high dielectric film. Also, the capacitor having a two-dimensional structure is changed to have a three-dimensional cylinder structure or a trench structure, thereby increasing the surface of both electrodes of the capacitor.

As the design rule is reduced, the plane area where a capacitor can be formed is reduced, and it is difficult to develop materials for constituting an insulating film in the capacitor. As a result, the junction resistance value of the storage node (SN) and the turn-on resistance value of the transistor in the unit cell are greater, it is difficult to perform normal read and write operations, and refresh characteristics are deteriorated.

To improve the above-described shortcomings, the unit cell includes a transistor having a floating body. That is, the unit cell of the semiconductor memory apparatus does not include a capacitor used for storing data, but stores data in a floating body of the transistor included in the unit cell. To store data in the floating body, the voltage level supplied on the word line is reduced by ½ or ⅓ of the voltage level applied to the bit line connected to one active region of the transistor, thereby generating hot carriers. When the data "1" is delivered, a large amount of hot carriers are generated in a junction region of the bit lines BL. Then, electrons are slipped out into the bit line BL and holes remain in the floating body. When the data "0" is transmitted, the hot carriers are not generated in the junction region, and no holes remain in the floating body FB. The holes kept in the floating body lower the threshold voltage of the transistor of the unit cell; consequently the amount of current flowing through the transistor increases. That is, the amount of the current flowing when the holes are stored in the floating body of the transistor is greater than that flowing when no holes are stored. As a result, it is possible to distinguish whether the data "1" or "0" is stored in the unit cell.

The semiconductor memory apparatus that includes the floating body transistor does not include a capacitor, thereby improving the integration. However, it is difficult to prevent reduction of the number of holes that the floating body of the transistor stores because of the leakage current that occurs at the source line junction or the bit line junction. Generally, the active region of the transistor, which is connected to the bit line or the source line, includes impurities of high concentration to reduce resistance resulting from junction with metal layers. However, if the active region (e.g., source or drain region) of the transistor contains impurities of high concentration, the amount of leakage current between the active region and the floating body may increase. As a result, the number of holes stored in the floating body dissipates as time goes by. Also, since the amount of the leakage current increases in proportion to temperature, data stored in the transistor of the unit cell is easily deleted (lost) under a high temperature.

FIGS. 1a to 1e are cross-sectional diagrams illustrating a method for manufacturing a floating body transistor in a general semiconductor memory apparatus.

Referring to FIG. 1a, a gate pattern 103 including a gate electrode and a hard mask for protecting the gate electrode is formed over a silicon active region 101. The semiconductor memory apparatus including the floating body transistor is fabricated with a silicon-on-insulator (SOI) wafer including a lower insulating oxide layer 102 and the silicon active region 101 formed over the lower insulating oxide layer 102. The SOI wafer includes an insulating layer that is artificially formed between the top surface (silicon active region) and a silicon substrate to remove the impact from the silicon substrate, thereby improving the process, efficiency and characteristics of a high-pure silicon layer formed over the insulating layer. Since the SOI wafer provides a zero-defective thin silicon layer isolated with an insulating material (thermal oxide film), an insulating wall or a well-forming process is not required, so that the product developing and producing time and cost are reduced. Also, there is no burden on additional equipment investment because the equipment for general silicon wafer products is also available for SOI wafer products.

Referring to FIG. 1b, an interlayer dielectric (ILD) oxide film 104 is formed over the resulting structure including the gate pattern 103.

Referring to FIG. 1c, the ILD oxide film 104 is etched to form a self-aligned contact (SAC), thereby obtaining a contact hole 105 and an ILD oxide film 104a that remains on a spot having no contact hole 105. A part of the upper portion of the silicon active region 101 exposed between gate patterns 103 is etched.

Referring to FIG. 1d, an ion-implanting process is performed on the exposed contact hole 105 to form a landing plug contact (LPC) 108.

Referring to FIG. 1e, a polysilicon film 109 of high concentration is deposited in the exposed contact hole 105. A diffusion process is performed at a high temperature after the polysilicon film 109 is filled in the exposed contact hole 105. When the diffusion process is performed at a high temperature, the landing plug contact 108 formed in the silicon active region 101 by ion-implantation diffuses to the lower insulating oxide layer 102, thereby isolating floating bodies of each transistor.

Referring to FIG. 1e, when the diffusion process is performed at a high temperature after the polysilicon film 109 of high concentration ion-impurities are diffused vertically as well as horizontally, so that a diffusion plug 110 is formed, the horizontal diffusion may reduce the volume of the body of each transistor, and a punch-through phenomenon, whereby may occur in the upper or lower portion of the floating body formed in the silicon active region 101. Particularly, the punch-through phenomenon frequently occurs in the lower portion of the floating body having a lower concentration of impurities rather than in the upper portion of the floating body where the concentration of impurities increases by channel doping when the gate pattern 103 is formed.

In the floating body transistor fabricated over the SOI wafer, it is advantageous to isolate cells in a single active region rather than to isolate unit cells through a device isolation film by the (STI) Shallow Trench Isolation process to maximize the cell packing density. The cell packing density is the number of unit cells per length, area or volume of the memory apparatus. When the cell packing density is maximized, a unit cell having an area of $4F^2$ or $6F^2$ is formed. Herein, F is the minimum distance between fine patterns, according to a design rule.

While the size of each unit cell is reduced, the volume of the floating body is maximized so that more holes may be stored in the floating body corresponding to the data. To maximize the volume of the body of the transistor, a three-dimensional transistor having a fin region or a transistor having a plane channel region is preferably used rather than a three-dimensional transistor having a recess gate. However, when the full size of the transistor is reduced, the distance between the source and drain regions of the transistor having a plane channel region is reduced, enabling a punch-through phenomenon that is difficult to prevent.

Although the punch-through phenomenon does not occur after the diffusion process is performed at a high temperature, the horizontal diffusion reduces the volume of the floating body. If the volume of the floating body is reduced, the number of holes accumulated in the floating body that are able to correspond to data is reduced. The reduction of the floating body effect means a decrease in the capacity of storing data in unit cells for a long duration and in a sensing margin of data outputted from unit cells. That is, the operating margin of unit cells in the semiconductor memory apparatus is reduced.

BRIEF SUMMARY OF THE INVENTION

Various embodiments of the present invention are directed to providing a semiconductor device and a method for fabricating the same. In the method, the upper portion of a landing plug is preferably formed to be broader than the lower portion of the landing plug in the manufacturing of a floating body transistor so as to prevent the volume of the floating body from being reduced. Also, the ion-implanting process is preferably performed on the lower portion of the floating body to increase the concentration to prevent a punch-through phenomenon.

According to an embodiment of the present invention, a method for fabricating a semiconductor device includes: forming a gate pattern over a silicon active region and an insulating layer, which form a semiconductor substrate; removing the silicon active region exposed between the gate patterns; and filling a space between the gate patterns to form a plug.

Preferably, removing-the-silicon-active-region includes: etching a part of the silicon active region; forming a spacer on sidewalls of the gate pattern and the silicon active region; and etching the silicon layer between the spacers to expose the insulating layer.

Preferably, forming-a-spacer includes: forming an oxide film over the gate pattern and the silicon active region; and blanket-etching the oxide film so that the oxide film remains on sidewalls of the gate pattern and the silicon active region.

Preferably, the silicon active region, which remains below the gate pattern, has a lower portion that is broader than an upper portion by more than the thickness of the spacer.

Preferably, etching-a-part-of-the-silicon-active-region includes forming an interlayer insulating film over the resulting structure including the gate pattern and etching the interlayer insulating film between the gate patterns with a landing contact mask to expose the silicon layer.

The method further comprises implanting impurities into a lower portion of the silicon active region by a tilt ion-implantation method.

According to an embodiment, a method for fabricating a semiconductor device includes: etching a portion of a substrate to form a trench; forming a protective film on sidewalls of the trench; and forming a floating body of a transistor by etching a lower portion of the trench.

Preferably, the substrate is a silicon-on-insulator (SOI) wafer including an insulating layer and a silicon active region.

The method further includes forming a gate pattern over the substrate.

Preferably, forming-a-floating-body-of-a-transistor includes: etching the silicon active region between the gate patterns; forming a protective film over the resulting structure including the gate pattern and the silicon active region; etching the protective film so that the protective film remains on sidewalls of the gate pattern and the silicon active region; and removing the exposed silicon active region.

Preferably, the protective film includes an oxide film.

The method can further include: implanting impurities into the floating body through a tilt ion-implantation method; and forming a landing plug between the floating bodies.

Preferably, the landing plug includes a conductive material.

According to an embodiment, a semiconductor device includes a floating body transistor that includes a floating body where a lower portion is broader than an upper portion at the bottom of a gate pattern as a cell transistor.

Preferably, the floating body includes a local doping region at lower sidewalls, which has a higher ion-concentration than a central region of the floating body.

Preferably, the floating body is formed in a silicon active region over a silicon-on-insulator (SOI) wafer that includes an insulating layer and the silicon active region.

Preferably, both sides of the floating body contact a conductive material.

Preferably, the conductive material is connected to a bit line and a source line.

Preferably, the floating body transistor stores holes generated by hot carriers when the delivered data is "1".

Preferably, the floating body has a sloped side surface.

BRIEF DESCRIPTION OF THE DRAWINGS

For a more complete understanding of the disclosure, reference should be made to the following detailed description and accompanying drawings.

Figure 1A:
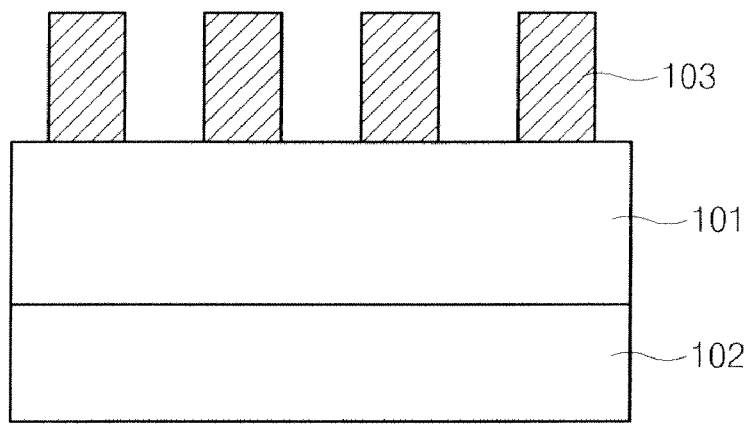
FIGS. 1a to 1e are cross-sectional diagrams illustrating a method for manufacturing a floating body transistor in a general semiconductor memory apparatus.
Figure 1B:
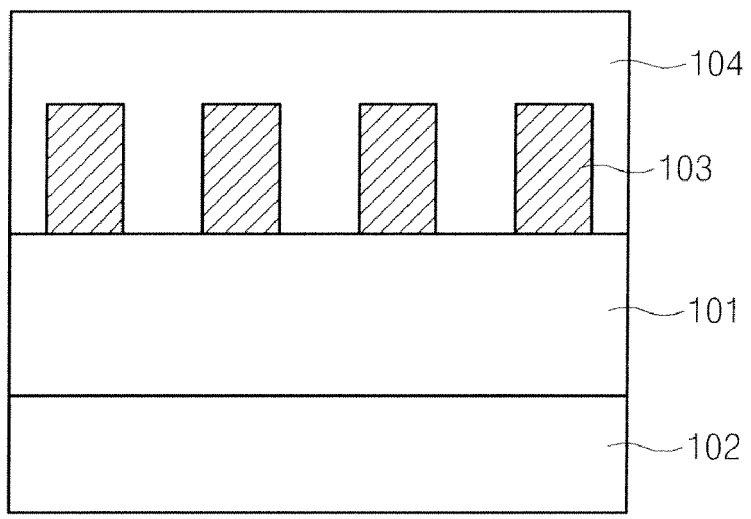
Figure 1C:
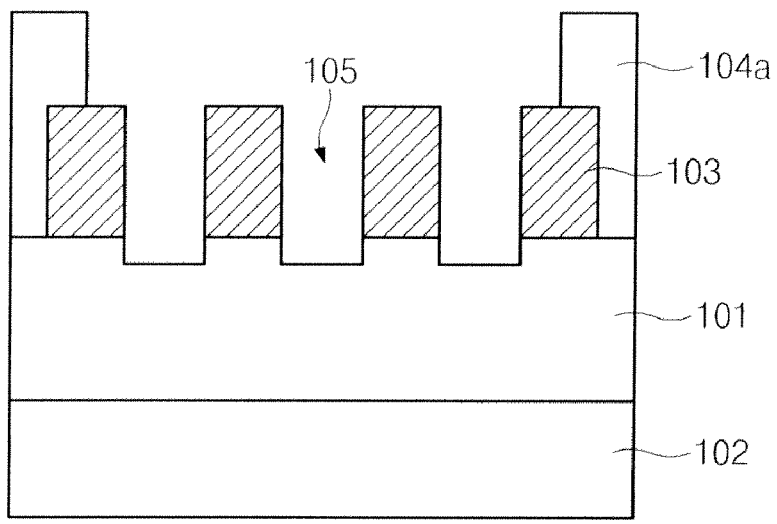
Figure 1D:
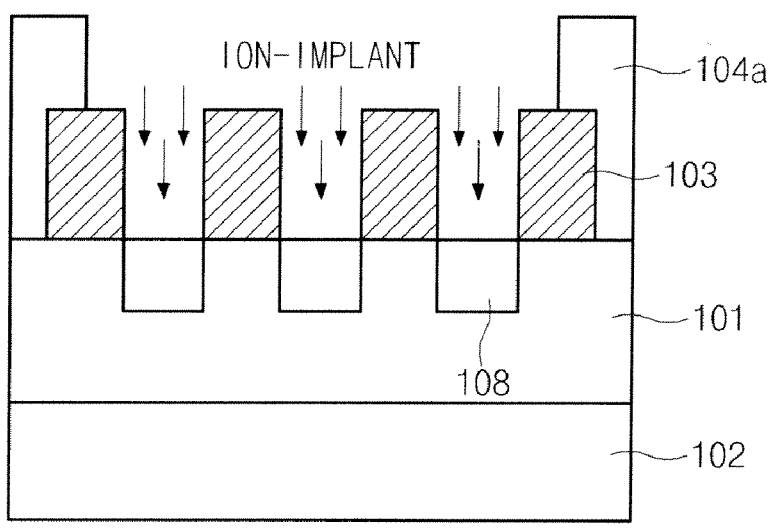

While the disclosed method is susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DESCRIPTION OF EMBODIMENTS

FIGS. 2a to 2g are cross-sectional diagrams illustrating a method for manufacturing a floating body transistor in a semiconductor memory apparatus according to an embodiment of the present invention.

Figure 2A:
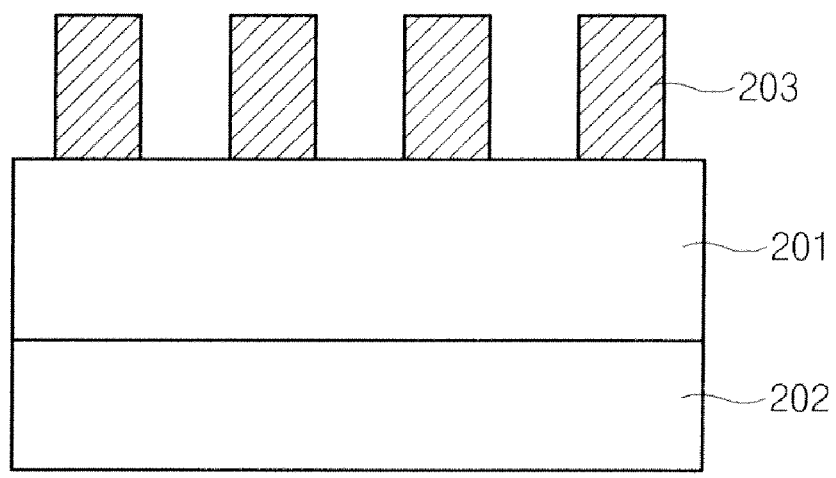
FIGS. 2a to 2g are cross-sectional diagrams illustrating a method for manufacturing a floating body transistor in a semiconductor memory apparatus according to an embodiment of the present invention.

Referring to FIG. 2a, a gate pattern 203 including a gate electrode and a hard mask for protecting the gate electrode is formed over a silicon active region 201. Impurities are doped between the gate patterns 203 to form a lightly doped drain (LDD) (not shown). According to an embodiment, a semiconductor memory apparatus including a floating body transistor is preferably fabricated with a silicon-on-insulator (SOI) wafer including a lower insulating oxide layer 202 and the silicon active region 201 formed over the lower insulating oxide layer 202.

Figure 2B:
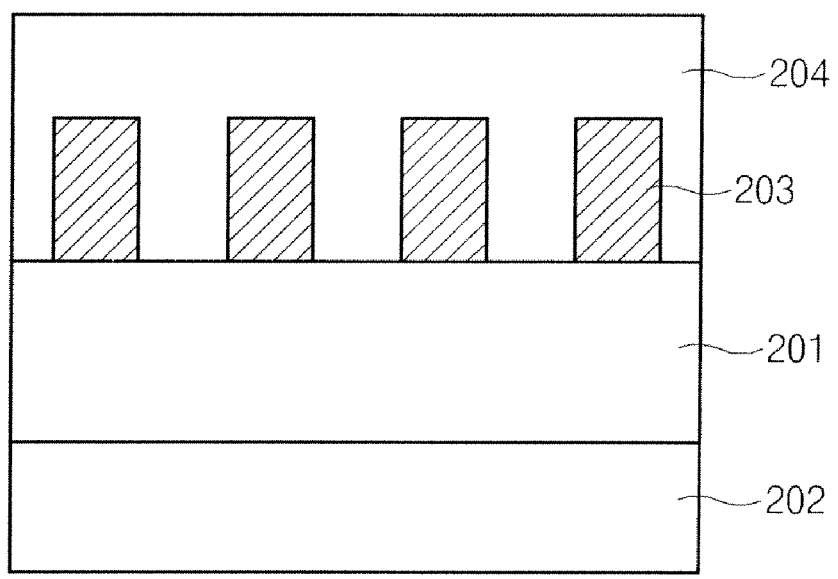

Referring to FIG. 2b, an interlayer dielectric (ILD) oxide film 204 is formed over the resulting structure including the gate pattern 203.

Figure 2C:
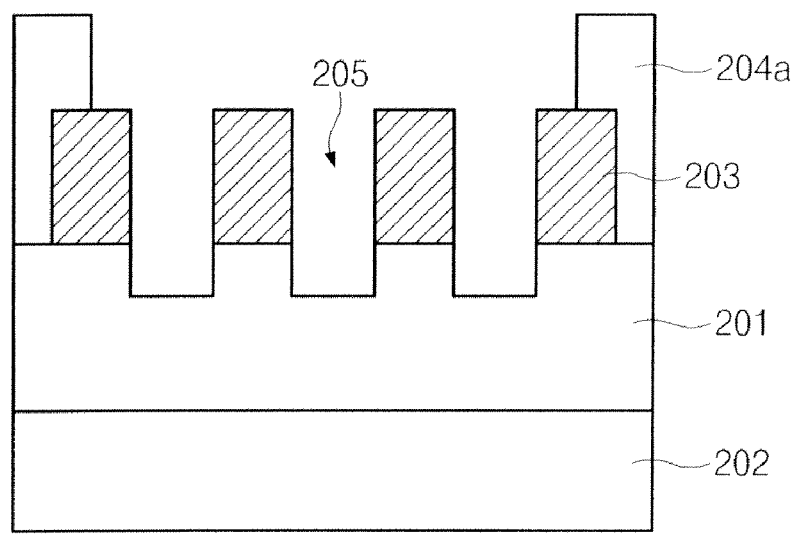

Referring to FIG. 2c, to form a self-aligned contact (SAC), the ILD oxide film 204 is preferably etched with a landing plug contact mask, thereby obtaining a contact hole 205. An ILD oxide film 204a preferably remains in a place having no contact hole 205. A partial upper portion of the silicon active region 201 is exposed between gate patterns 203. The silicon active region 201 is preferably etched deeper than in conventional art.

Figure 2D:
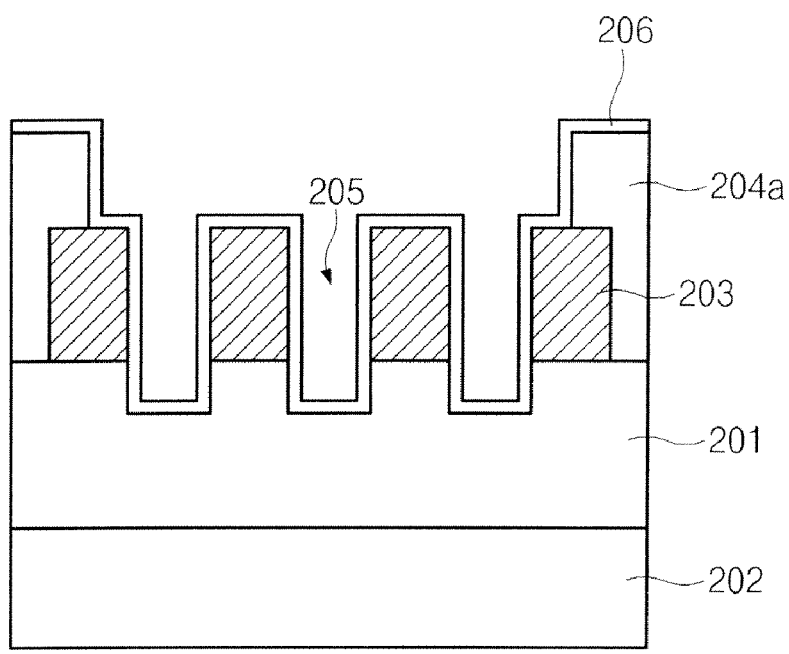

Referring to FIG. 2d, an oxide film 206 is formed on the gate pattern exposed by the contact hole 205, the silicon active region 201, and the residual ILD oxide film 204a.

Figure 2E:
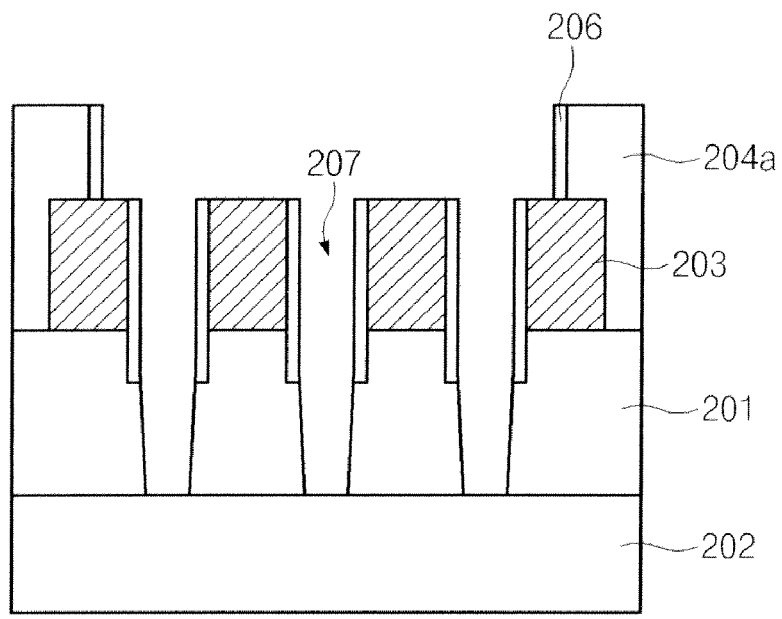

Referring to FIG. 2e, the oxide film 206 is preferably blanket-etched like an etching process for forming a spacer at sidewalls of a conventional gate pattern, thereby removing the oxide film 206 formed over the ILD oxide film 204a, the gate pattern 203, and the silicon active region 201. After the blanket-etch process, the oxide film 206 considered as a spacer, remains on sidewalls of the ILD oxide film 204a, the gate pattern 203, and the silicon active region 201. The silicon active region 201 exposed between the oxide films 206 that remain on the sidewalls of the gate pattern 203 is preferably etched until the lower insulating oxide layer 202 is exposed, thereby obtaining a landing plug forming region 207. The silicon active region 201 that remains in the bottom of the gate pattern 203 is formed in the shape of a trapezoid. That is, the lower portion is broader than the upper portion in the silicon active region 201. This shape of the silicon active region 201 is obtained generally when a material deposited between conventional fine patterns is deeply etched. Thus, in the invention, it is not necessary to perform an additional etch process to prevent sidewalls of the silicon active region 201 from being tilted. The lower insulating oxide layer 202 is preferably exposed so that the silicon active region 201 that remains in the lower portion of each gate pattern 203 is separated. If the sidewall inclination of the silicon active region 201 is reduced, the volume of the floating body becomes larger.

Figure 2F:
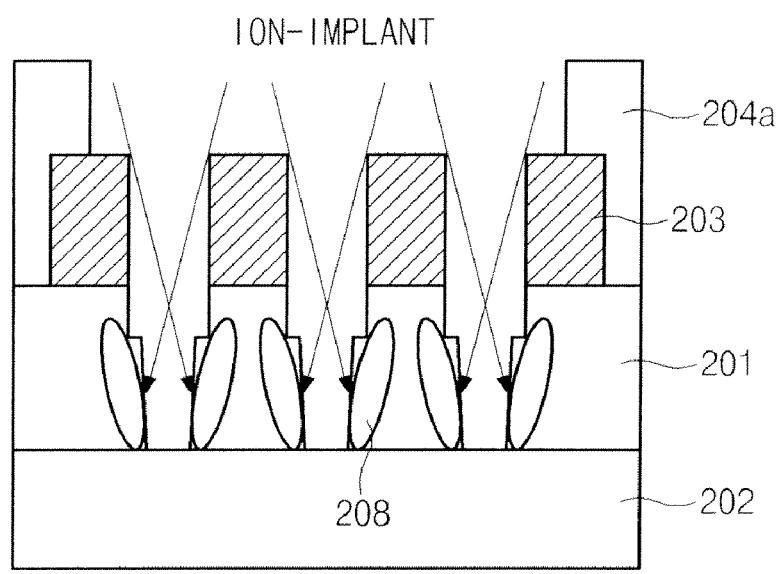

Referring to FIG. 2f, after the oxide film 206 that remains on the gate pattern 203, the silicon active region 201, and the ILD film 204a is removed, an ion-implanting process is performed on the lower portion of the silicon active region 201 corresponding to the lower region of the floating body, thereby obtaining a local doping region 208. Ion-impurities are halo-doped on the lower portion of the silicon active region 201 by tilt ion-implantation or slant implanting. The halo-implant area can be described as a region doped with impurities in source and drain regions of the transistor to prevent a punch-through phenomenon that may occur when a distance between a source and a drain becomes shorter as the size of the transistor becomes smaller.

Through this process, the silicon active region 201 formed as a floating body in the lower portion of the gate pattern 203 preferably has an a lower portion formed to be broader than its upper portion, thereby preventing the punch-through phenomenon that occurs in the lower region of the silicon active region 201 having a low impurity concentration. Furthermore, ions are implanted into the lower portion of the silicon active region 201 by tilt ion-implantation, thereby preventing the punch-through phenomenon.

Figure 2G:
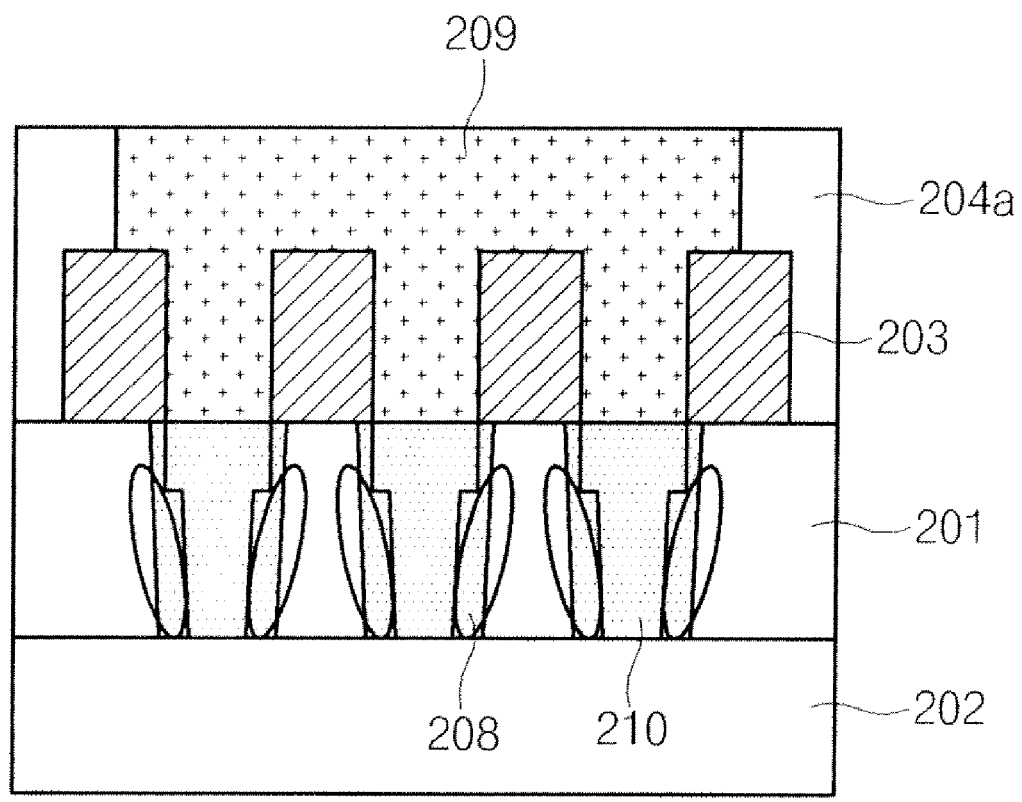

Referring to FIG. 2g, the landing plug forming region 207 is filled with a conductive material, preferably with polysilicon, thereby forming a landing plug 209. The polysilicon in the process of forming the landing plug 209 is diffused horizontally into the silicon active region 201, thereby obtaining a diffusion plug 210.

Figure 1E:
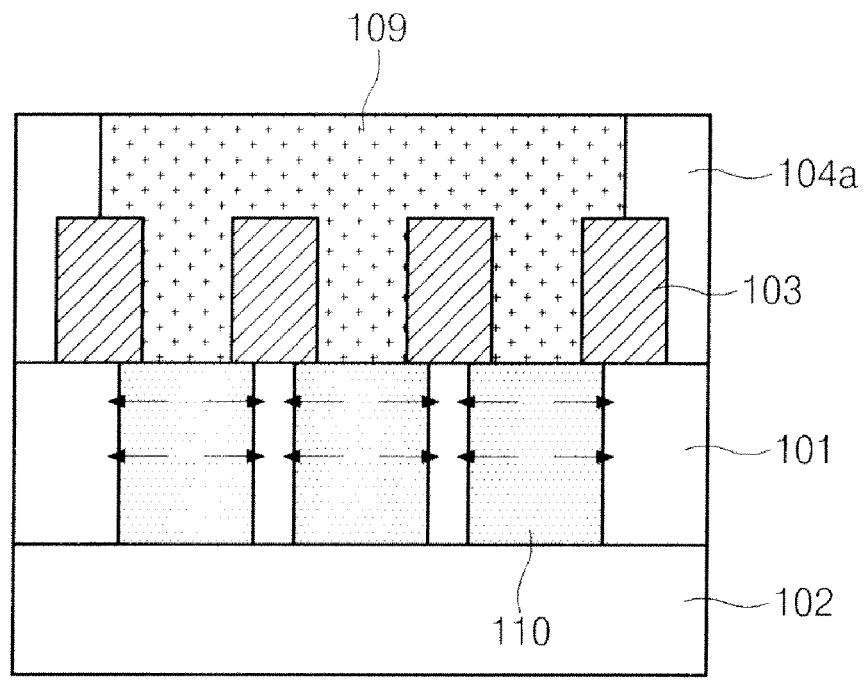

In the conventional art, referring to FIG. 1e, the polysilicon 109 of high concentration is deposited over the landing plug 108 formed in the silicon active region 101. The landing plug 108 is diffused into the lower insulating oxide layer 102 through thermal treatment performed at a high temperature, thereby separating the floating bodies of the transistor from each other through the diffusion plug 110. That is, the diffusion plug 110 is formed as the polysilicon 109 of high concentration and the landing plug 108 is subjected to a thermal treatment performed at a high temperature. However, in the embodiment of the present invention, because the floating bodies of the transistor are separated previously, the process for forming the landing plug 108 through ion-implantation is not required. Moreover, the polysilicon for forming the landing plug 209 is not required to have a high concentration. Also, except for a thermal treatment for depositing the polysilicon, it is not necessary to perform a diffusion process, for example, a thermal treatment performed at a high temperature, for diffusion of the landing plug 209.

As described above, in an embodiment, to form a landing plug, the silicon active region 201 is etched in the two steps, so that the lower portion of the silicon active region 201 used as a floating body is preferably formed to be broader than the upper portion of the silicon active region 201, thereby preventing the punch-through phenomenon that occurs in the floating body. The silicon active region 201 is preferably etched until the lower insulating oxide layer 202 is exposed, so that it is possible to separate the floating bodies between each transistor without reducing the thickness of the silicon active region 201.

Furthermore, the landing plug 209 is formed deep to the lower insulating oxide layer 202, and the silicon active region 201 in the landing plug region 207 is removed, so that the ion-implanting process for forming the landing plug 209 is not required. The junction area between the silicon active region 201, which is a floating body, and the landing plug 209 increases because the landing plug 209 is formed in contact with the lower insulating oxide layer 202, thereby reducing junction resistance.

The inclination of the side surface of the trapezoidal silicon active region 201 located in the lower portion of the gate pattern 103 increases the effect of the tilt implantation. Although there is a limit in the tilt angle of the ion-implantation process due to the gate pattern 103 having a narrow interval, the limit of the tilt angle of the ion-implantation process increases corresponding to the inclination degree of the side surface of the silicon active region 201.

As a result, the floating transistor in the semiconductor memory apparatus fabricated according to the embodiment of the present invention to prevent the punch-through phenomenon can be formed to have a smaller size. That is, as the size of the floating body transistor is reduced, the increased possibility of the punch-through phenomenon occurrence can be decreased, so that it is possible to manufacture a smaller-sized floating body transistor.

A semiconductor memory apparatus fabricated by the above-described method includes a floating body transistor that has a floating body, where the lower portion is broader than the upper portion, under a gate pattern as a cell transistor. Although a unit cell in a conventional semiconductor memory apparatus includes a transistor and a capacitor, a unit cell of the semiconductor memory apparatus includes a floating body transistor without a capacitor. When the delivered data is "1", the floating body transistor stores holes generated by hot carriers, and amplifies data using a difference in the amount of charges flowing through a channel of the transistor depending on the holes stored in the floating body when the data is "0" and "1".

Specifically, the local doping region 208 having a high implanted ion impurity concentration is formed in the lower portion of the floating body in the semiconductor memory apparatus. The floating body is formed in the silicon active region 201 of the SOI wafer including the lower insulating oxide layer 202 and the silicon active region 201. Both sides of the floating body preferably contact conductive materials, which are connected to a bit line and a source line.

Particularly, the side surface of the floating body in the semiconductor memory apparatus obtained through the twice etching process is sloped. Moreover, the lower portion of the floating body is formed to be broader than the upper portion, thereby preventing the punch-through phenomenon between source and drain regions located at both sides of the floating body.

The above embodiments of the present invention are illustrative and not limiting. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or a non-volatile memory device. While the present invention has been described with respect to the specific embodiments, it will be apparent to those skilled in the art that various changes and modifications may be made without departing from the spirit and scope of the invention as defined in the following claims.

The invention claimed is:

1. A semiconductor device comprising a floating body transistor that comprises more than one floating body comprising a lower portion broader than an upper portion in a bottom of a gate pattern as a cell transistor; and a landing plug between two floating bodies.

2. The semiconductor device according to claim 1, wherein the floating body comprises a local doping region at lower sidewalls, which has a higher ion-concentration than a central region of the floating body.

3. The semiconductor device according to claim 1, wherein the floating body is in a silicon active region of a silicon-on-insulator (SOI) wafer that comprises an insulating layer and the silicon active region.

4. The semiconductor device according to claim 2, wherein both sides of the floating body contact a conductive material.

5. The semiconductor device according to claim 4, wherein the conductive material is connected to a bit line and a source line.

6. The semiconductor device according to claim 1, wherein the floating body transistor stores holes generated by hot carriers when delivered data is "1".

7. The semiconductor device according to claim 1, wherein the floating body has a sloped side surface.

* * * * *